US012683598B2

(12) United States Patent
Sano et al.

(10) Patent No.: US 12,683,598 B2
(45) Date of Patent: Jul. 14, 2026

(54) SEMICONDUCTOR ELEMENT DRIVING APPARATUS

(71) Applicant: Mitsubishi Electric Corporation, Tokyo (JP)

(72) Inventors: Shohei Sano, Fukuoka (JP); Motoki Imanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 182 days.

(21) Appl. No.: 18/793,701

(22) Filed: Aug. 2, 2024

(65) Prior Publication Data

US 2025/0158607 A1 May 15, 2025

(30) Foreign Application Priority Data

Nov. 9, 2023 (JP) ................................. 2023-191264

(51) Int. Cl.
| | |
|---|---|
| *H02H 3/00* | (2006.01) |
| *H03K 17/0812* | (2006.01) |
| *H02M 1/08* | (2006.01) |
| *H02M 1/32* | (2007.01) |

(52) U.S. Cl.
CPC ......... *H03K 17/08128* (2013.01); *H02M 1/08* (2013.01); *H02M 1/32* (2013.01)

(58) Field of Classification Search
CPC ....... H03K 17/08128; H03K 17/08122; H03K 17/08; H03K 17/687; H03K 3/012; H02M 1/08; H02M 1/32

USPC .......................................................... 361/78
See application file for complete search history.

(56) References Cited

U.S. PATENT DOCUMENTS

| | | | |
|---|---|---|---|
| 2014/0218097 A1 * | 8/2014 | Barrenscheen | H03K 17/18 327/379 |
| 2020/0350905 A1 * | 11/2020 | Bang | H03K 17/0822 |
| 2023/0129767 A1 | 4/2023 | Nishibata | |
| 2023/0420930 A1 * | 12/2023 | Ishikawa | H02H 7/122 |
| 2023/0421045 A1 | 12/2023 | Sugihara | |

FOREIGN PATENT DOCUMENTS

| | | |
|---|---|---|
| JP | 2022-007119 A | 1/2022 |
| JP | 2022-148865 A | 10/2022 |
| WO | 2023/105943 A1 | 6/2023 |

* cited by examiner

*Primary Examiner* — Crystal L Hammond
*Assistant Examiner* — Lucy M Thomas
(74) *Attorney, Agent, or Firm* — Studebaker Brackett PLLC

(57) ABSTRACT

A semiconductor element driving apparatus includes a primary circuit, a signal transmission circuit including an insulating element, and a secondary circuit that drives a semiconductor element based on a plurality of transmission signals corresponding to a plurality of signals transmitted from the primary circuit through the signal transmission circuit. The secondary circuit includes an ASC mode determination circuit that determines whether a normal mode or an ASC mode is executed based on a transmission transition signal corresponding to a transition signal or to a control transition signal among the plurality of transmission signals.

13 Claims, 9 Drawing Sheets

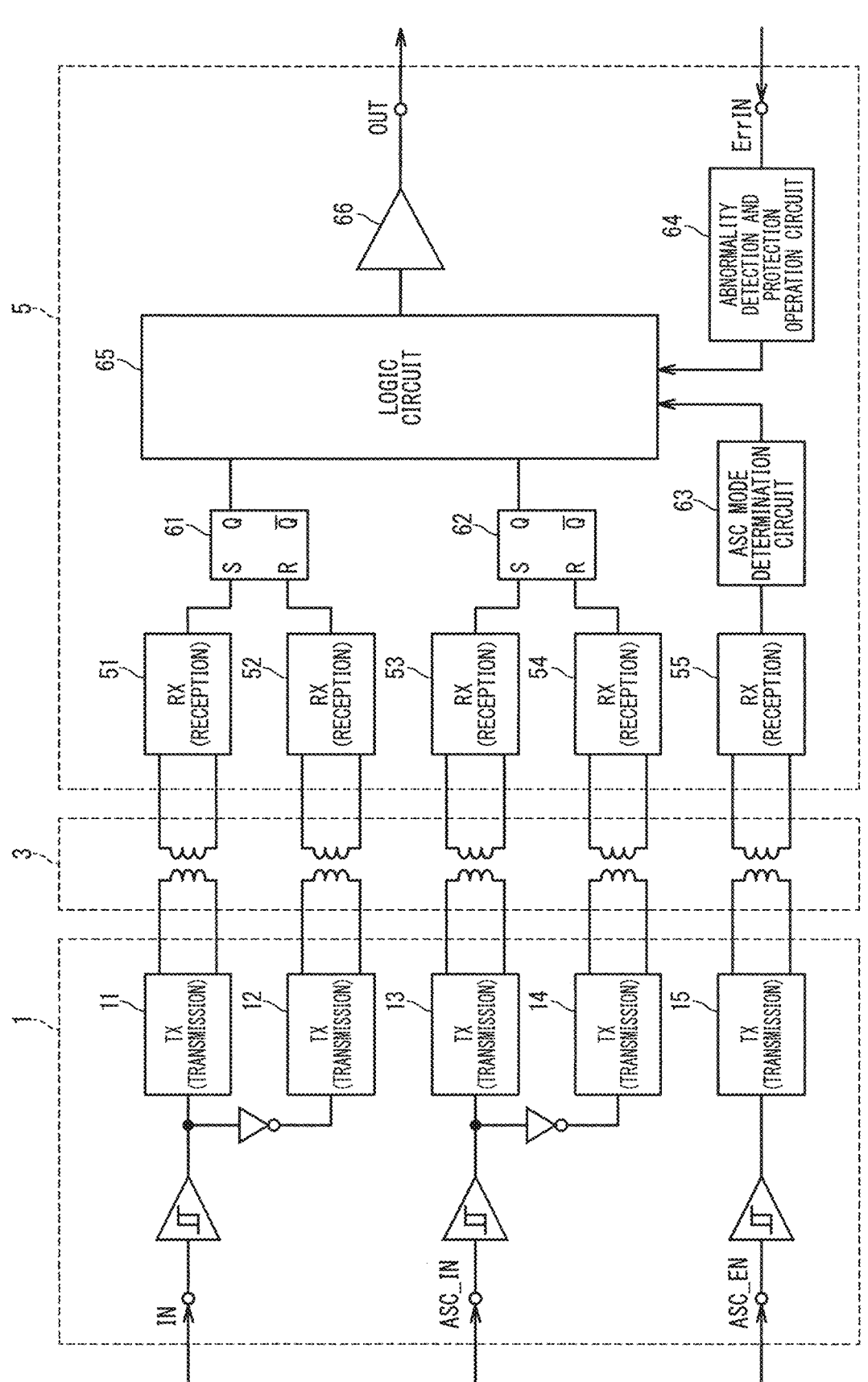
F I G. 1

F I G. 3
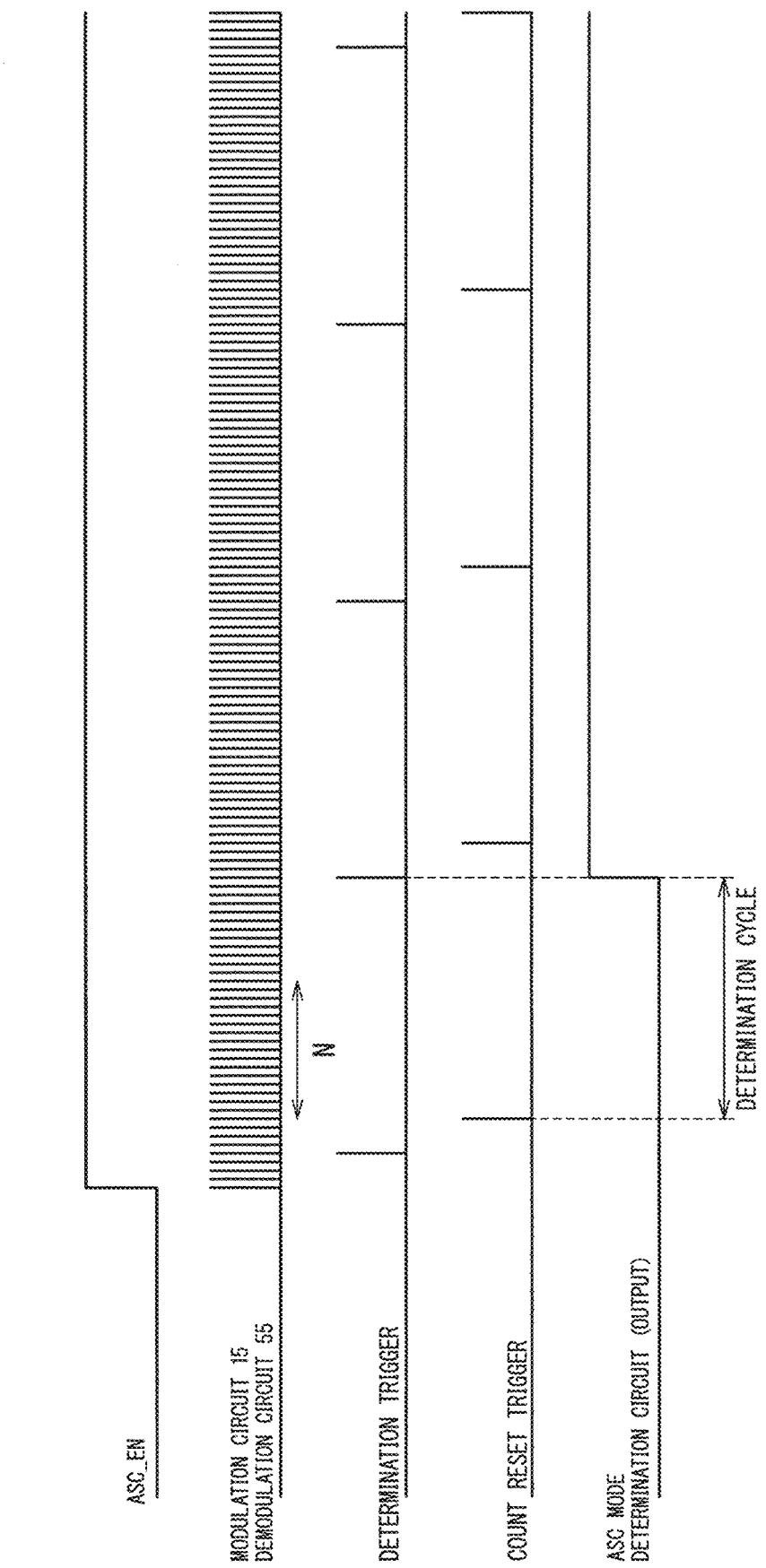

F I G. 5
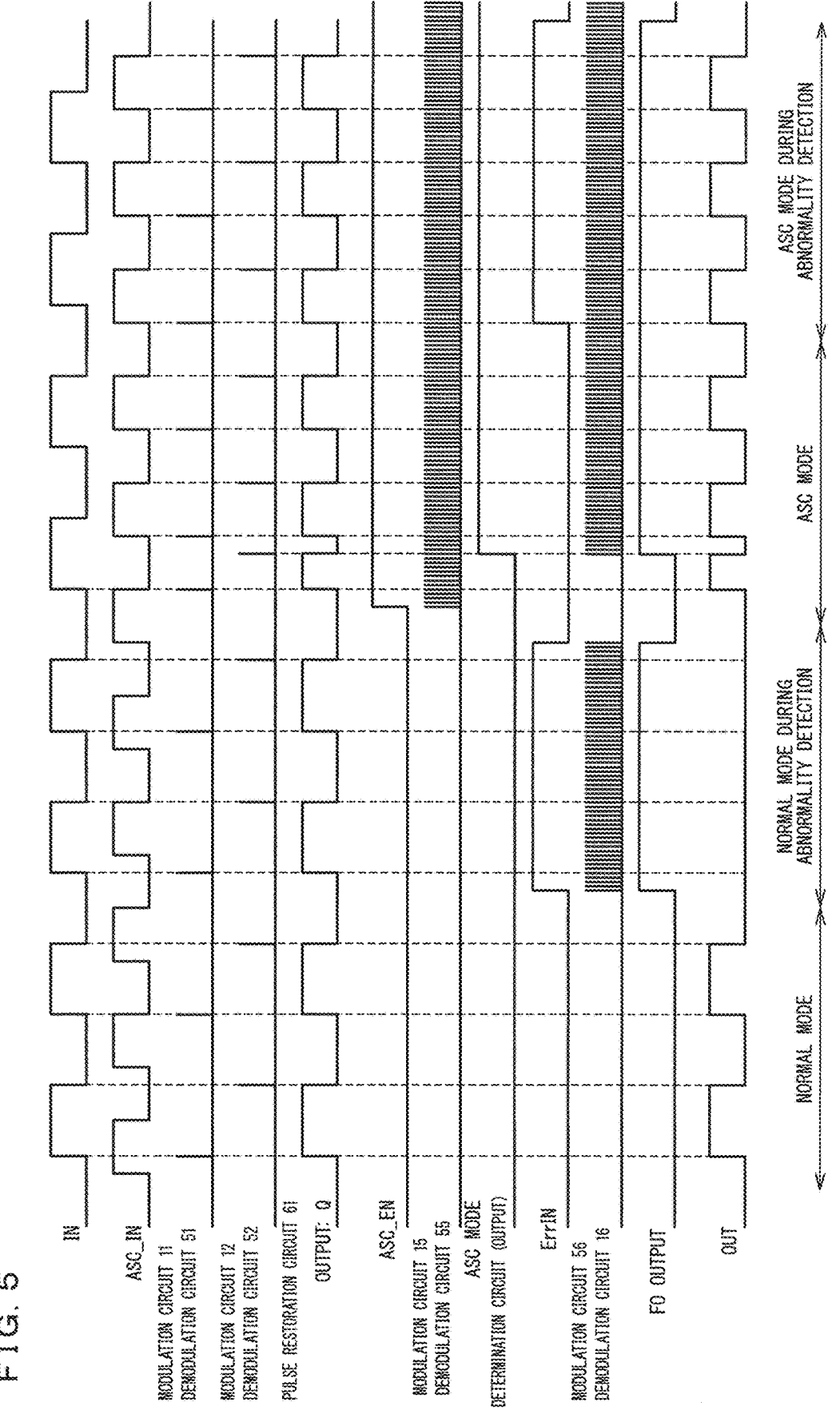

F I G . 8
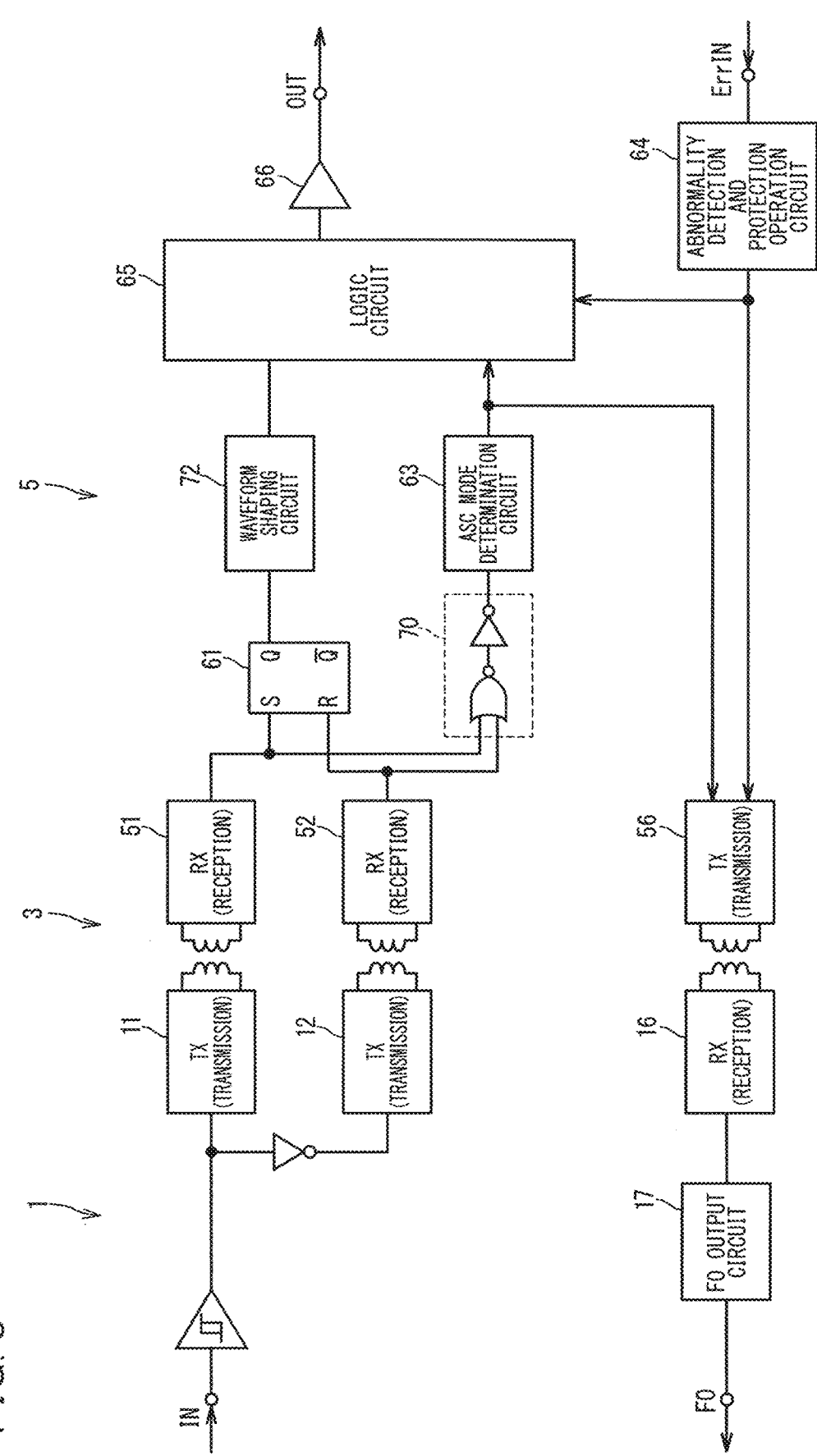

SEMICONDUCTOR ELEMENT DRIVING APPARATUS

BACKGROUND OF THE INVENTION

Field of the Invention

The present disclosure relates to a semiconductor element driving apparatus.

Description of the Background Art

Various techniques have been proposed for a semiconductor element driving apparatus that drives a semiconductor element such as an insulated gate bipolar transistor (IGBT) of an inverter system. For example, a technique in which a primary circuit transmits a signal to a secondary circuit through an insulating element capable of transmitting the signal, and thus the secondary circuit drives the semiconductor element has been proposed. As an example, WO2023/105943 A proposes a technique in which the primary circuit transmits a second control signal driving the semiconductor element during an active short circuit (ASC) mode to the secondary circuit in preference to a first control signal driving the semiconductor element during a normal mode. That is, a technique in which the primary circuit to which the first control signal is input without receiving the second control signal transmits the first control signal to the secondary circuit and the primary circuit to which the second control signal is input transmits the second control signal to the secondary circuit regardless of the input of the first control signal has been proposed.

However, in the technique of WO2023/105943 A, the secondary circuit cannot determine whether the normal mode or the ASC mode is executed. For this reason, the secondary circuit has a problem that the operation during the ASC mode cannot be made different from the operation during the normal mode.

SUMMARY

The present disclosure has been made in view of the above problem, and an object of the present disclosure is to provide a technique that enables the secondary circuit to determine whether the ASC mode is executed.

A semiconductor element driving apparatus according to the present disclosure includes: a primary circuit to which a plurality of signals including a first control signal controlling driving of a semiconductor element during a normal mode, a second control signal controlling driving of the semiconductor element during an ASC mode, and a transition signal transitioning from the normal mode to the ASC mode, or including the first control signal and a control transition signal corresponding to the second control signal and to the transition signal are input; a signal transmission circuit including an insulating element capable of transmitting a signal; and a secondary circuit that drives the semiconductor element based on a plurality of transmission signals corresponding to the plurality of signals transmitted from the primary circuit through the signal transmission circuit. The secondary circuit includes: an ASC mode determination circuit that determines whether the normal mode or the ASC mode is executed based on a transmission transition signal corresponding to the transition signal or to the control transition signal among the plurality of transmission signals; and a logic circuit that drives the semiconductor element based on a first transmission control signal corresponding to the first control signal among the plurality of transmission signals when the ASC mode determination circuit determines that the normal mode is executed, and drives the semiconductor element based on a second transmission control signal corresponding to the second control signal or to the control transition signal among the plurality of transmission signals when the ASC mode determination circuit determines that the ASC mode is executed.

The secondary circuit can determine whether the ASC mode is executed.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a circuit diagram illustrating a configuration of a semiconductor element driving apparatus according to a first preferred embodiment;

FIG. 3 is a timing chart illustrating operation of an ASC mode determination circuit according to the first preferred embodiment;

FIG. 5 is a timing chart illustrating operation of the semiconductor element driving apparatus according to the second preferred embodiment;

FIG. 8 is a circuit diagram illustrating a configuration of a semiconductor element driving apparatus according to a fourth preferred embodiment.

DESCRIPTION OF THE PREFERRED EMBODIMENTS

Figure 2:
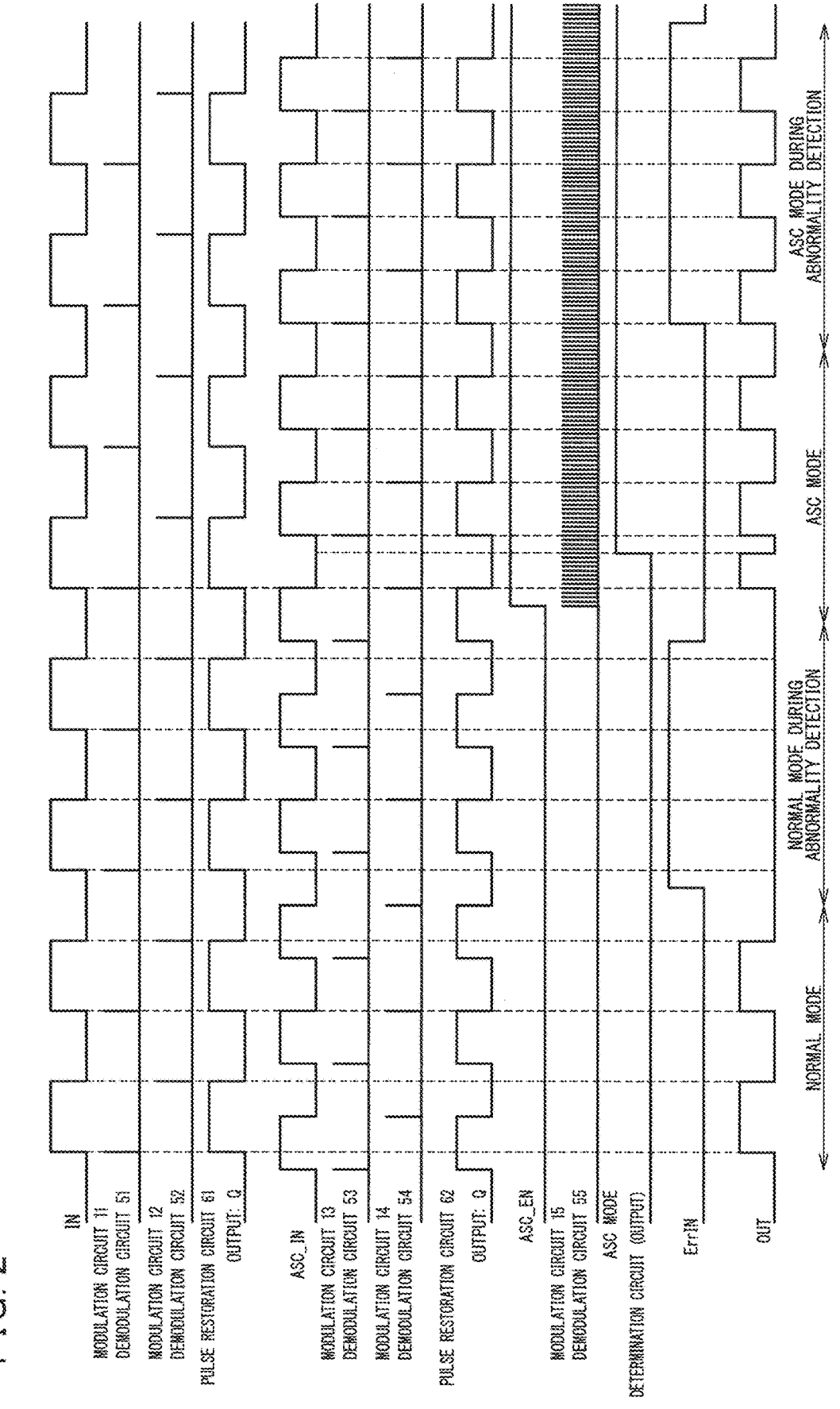
FIG. 2 is a timing chart illustrating operation of the semiconductor element driving apparatus according to the first preferred embodiment.

Hereinafter, embodiments will be described with reference to the accompanying drawings. Features described in the following embodiments are examples, and all features are not necessarily essential. In the following description, similar components in a plurality of embodiments are denoted by the same or similar reference numerals, and different components will be mainly described.

First Preferred Embodiment

FIG. 1 is a circuit diagram illustrating a configuration of a semiconductor element driving apparatus according to a first preferred embodiment. The semiconductor element driving apparatus in FIG. 1 includes a primary circuit 1 to which a plurality of signals are input, a secondary circuit 5 that drives a semiconductor element (not illustrated), and a signal transmission circuit 3 including an insulating element capable of transmitting a signal from the primary circuit 1 to the secondary circuit 5. That is, the semiconductor element driving apparatus in FIG. 1 is a gate driver IC with a built-in insulating element. For example, the plurality of signals input to the primary circuit 1 are output from an electronic control unit (ECU) and a micro controller unit (MCU). The plurality of signals according to the first preferred embodiment include a first control signal that controls driving of the semiconductor element during a normal mode, a second control signal that controls driving of the semiconductor element during an active short circuit (ASC) mode, and a transition signal that make transition from the normal mode to the ASC mode.

The primary circuit 1 includes an IN terminal to which the first control signal is input, an ASC_IN terminal to which the second control signal is input, an ASC_EN terminal to which the transition signal is input, and modulation circuits 11, 12, 13, 14, 15. The modulation circuits 11, 12, 13, 14, 15 modulate the plurality of signals input to the primary circuit 1 into modulation signals that can be transmitted by the signal transmission circuit 3.

The signal transmission circuit 3 includes an insulating element (isolator) that can transmit a signal through an insulating portion such as a space. Hereinafter, a configuration in which the insulating elements are transformers magnetically coupled to each other as illustrated in FIG. 1 will be described as an example, but the present invention is not limited thereto. For example, the insulating elements may be capacitors capacitively coupled to each other, or may be photocouplers optically coupled to each other.

The secondary circuit 5 includes demodulation circuits 51, 52, 53, 54, 55, pulse restoration circuits 61, 62, an ASC mode determination circuit 63, an abnormality detection and protection operation circuit 64 that is an abnormality detection circuit, a logic circuit 65, a drive circuit 66, an OUT terminal, and an ErrIN terminal. The abnormality detection and protection operation circuit 64 and the ErrIN terminal are not necessarily provided.

The demodulation circuits 51 to 55 and the pulse restoration circuits 61, 62 generate a plurality of transmission signals corresponding to the plurality of signals of the primary circuit 1 based on the modulation signal transmitted from the primary circuit 1 through the signal transmission circuit 3.

In the first preferred embodiment, a first transmission control signal corresponding to the first control signal among the plurality of transmission signals has substantially the same waveform as the first control signal. A second transmission control signal corresponding to the second control signal among the plurality of transmission signals has substantially the same waveform as the second control signal. A transmission transition signal corresponding to the transition signal among the plurality of transmission signals has a waveform different from that of the transition signal. As described below, the secondary circuit 5 drives the semiconductor element based on the plurality of transmission signals including the first transmission control signal, the second transmission control signal, and the transmission transition signal.

The ASC mode determination circuit 63 determines whether the normal mode or the ASC mode is executed based on the transmission transition signal corresponding to the transition signal of the ASC_EN terminal, and outputs a determination signal indicating a determination result.

The abnormality detection and protection operation circuit 64 acquires a signal indicating an operation state of the semiconductor element through the ErrIN terminal. The abnormality detection and protection operation circuit 64 detects the abnormality of the semiconductor element based on the signal, and outputs an abnormality detection signal indicating a detection result of the abnormality of the semiconductor element. The abnormality of the semiconductor element may include the abnormality of the semiconductor element driving apparatus reflected in the operation state of the semiconductor element.

The first transmission control signal corresponding to the first control signal of the IN terminal, the second transmission control signal corresponding to the second control signal of the ASC_IN terminal, the determination signal from the ASC mode determination circuit 63, and the abnormality detection signal from the abnormality detection and protection operation circuit 64 are input to the logic circuit 65. The logic circuit 65 outputs a driving signal that drives the semiconductor element (not illustrated) from the drive circuit 66 through the OUT terminal based on the first transmission control signal, the second transmission control signal, the determination result of the ASC mode determination circuit 63, and the detection result of the abnormality detection and protection operation circuit 64.

In the first preferred embodiment, when the ASC mode determination circuit 63 determines that the normal mode is executed (that is, the ASC mode is not executed), the logic circuit 65 drives the semiconductor element based on the first transmission control signal in principle. However, when the ASC mode determination circuit 63 determines that the normal mode is executed and when the abnormality detection and protection operation circuit 64 detects the abnormality of the semiconductor element, the logic circuit 65 performs the operation of protecting the semiconductor element regardless of the first transmission control signal. For example, the operation of protecting the semiconductor element is the operation of shutting down the semiconductor element.

On the other hand, when the ASC mode determination circuit 63 determines that the ASC mode is executed, the logic circuit 65 drives the semiconductor element based on the second transmission control signal instead of the first transmission control signal. When the ASC mode determination circuit 63 determines that the ASC mode is executed and when the abnormality detection and protection operation circuit 64 detects the abnormality of the semiconductor element, the logic circuit 65 drives the semiconductor element based on the second transmission control signal without performing the operation of protecting the semiconductor element.

The semiconductor element (not illustrated) is driven by the driving signal output from the OUT terminal by the secondary circuit 5. For example, the semiconductor element is a semiconductor switching element of an inverter system that drives an inductive load such as a motor. For example, the semiconductor element includes an insulated gate bipolar transistor (IGBT), a reverse conducting-IGBT (RC-IGBT), and a metal oxide semiconductor field effect transistor (MOSFET). A material of the semiconductor element may contain normal silicon (Si), or may contain a wide band gap semiconductor such as silicon carbide (SIC), gallium nitride (GaN), or diamond. When the semiconductor element is formed of the wide band gap semiconductor, a stably operation at a high temperature and at a high voltage and an increase in a switching speed can be performed.

FIG. 2 is a timing chart illustrating operation of the semiconductor element driving apparatus according to the first preferred embodiment. The normal mode, the normal mode during the abnormality detection, the ASC mode, and the ASC mode during the abnormality detection will be described below. In the following description of each mode, an overlapping content will be omitted as appropriate.

<Normal Mode>

The modulation circuit 11 generates a modulation signal based on a rising edge of the first control signal input to the IN terminal, and the modulation circuit 12 generates a modulation signal based on a falling edge of the first control signal input to the IN terminal. That is, the modulation circuits 11, 12 generate the modulation signals by performing edge trigger modulation on the first control signal. The modulation signals generated by the modulation circuits 11, 12 are provided to the demodulation circuits 51, 52 through the signal transmission circuit 3, respectively.

The demodulation circuits 51, 52 output edge trigger signals equivalent to the modulation signals generated by the modulation circuits 11, 12 to an S terminal and a R terminal of the pulse restoration circuit 61, respectively. The pulse restoration circuit 61 generates the first transmission control signal having substantially the same waveform as the first control signal input to the primary circuit 1 based on the edge trigger signals output from the demodulation circuits 51, 52, and outputs the first transmission control signal from a Q terminal to the logic circuit 65. According to such a configuration, the first transmission control signal corresponding to the first control signal can be transmitted from the primary circuit 1 to the secondary circuit 5 without impairing square wave information about the first control signal while maintaining an insulation state between the primary circuit 1 and the secondary circuit 5.

The same processing as the first control signal is performed on the second control signal input to the ASC_IN terminal. Specifically, the modulation circuit 13 generates the modulation signal based on the rising edge of the second control signal, and the modulation circuit 14 generates the modulation signal based on the falling edge of the second control signal. That is, the modulation circuits 13, 14 generate the modulation signals by performing the edge trigger modulation on the second control signal. The modulation signals generated by the modulation circuits 13, 14 are provided to the demodulation circuits 53, 54 through the signal transmission circuit 3, respectively.

The demodulation circuits 53, 54 output the edge trigger signals equivalent to the modulation signals generated by the modulation circuits 13, 14 to the S terminal and the R terminal of the pulse restoration circuit 62, respectively. The pulse restoration circuit 62 generates the second transmission control signal having substantially the same waveform as the second control signal input to the primary circuit 1 based on the edge trigger signals output from the demodulation circuits 53, 54, and outputs the second transmission control signal from the Q terminal to the logic circuit 65.

During the normal mode, the transition signal of an invalid signal (Low) is input to the ASC_EN terminal. When the transition signal of the invalid signal is input to the modulation circuit 15, the modulation circuit 15 outputs the invalid signal, the invalid signal is transmitted to the demodulation circuit 55 through the signal transmission circuit 3, and the demodulation circuit 55 outputs the transmission transition signal of the invalid signal to the ASC mode determination circuit 63. The ASC mode determination circuit 63 determines that the normal mode is executed based on the transmission transition signal of the invalid signal, and outputs the determination signal of the invalid signal indicating the determination result to the logic circuit 65.

When the ASC mode determination circuit 63 determines that the normal mode is executed, the logic circuit 65 rejects the second transmission control signal corresponding to the second control signal, and outputs the driving signal to the OUT terminal based on the first transmission control signal corresponding to the first control signal.

<Normal Mode During Abnormality Detection>

When the abnormality is generated in the semiconductor element or the like during the normal mode, a valid signal (High) is input to the ErrIN terminal of the secondary circuit 5. When the valid signal is input to the ErrIN terminal, the abnormality detection and protection operation circuit 64 detects the abnormality of the semiconductor element, and outputs the abnormality detection signal of the valid signal to the logic circuit 65.

When the ASC mode determination circuit 63 determines that the normal mode is executed and when the abnormality detection and protection operation circuit 64 detects the abnormality of the semiconductor element, the logic circuit 65 outputs a signal (Low) that shuts down the semiconductor element to the OUT terminal regardless of the first transmission control signal.

<Asc Mode>

During the ASC mode, the transition signal of the valid signal is input to the ASC_EN terminal. When the transition signal is the valid signal, the modulation circuit 15 generates the modulation signal including a burst pulse by on-off-keying (OOK). The modulation signal is transmitted to the demodulation circuit 55 through the signal transmission circuit 3, and the demodulation circuit 55 outputs the transmission transition signal corresponding to the modulation signal to the ASC mode determination circuit 63. The transmission transition signal has substantially the same waveform as the modulation signal of the modulation circuit 15.

FIG. 3 is a timing chart illustrating the operation of the ASC mode determination circuit 63 according to the first preferred embodiment. The ASC mode determination circuit 63 generates a counter reset trigger that resets a count of pulses of the transmission transition signal to zero and a determination trigger that is used for the determination of the ASC mode determination circuit 63. A determining cycle is a period between the counter-reset trigger and the determining trigger.

The ASC mode determination circuit 63 determines that the ASC mode is executed when the pulse of the transmission transition signal is counted N times (N≥2) in the determination cycle that is a predetermined period. In this case, the ASC mode determination circuit 63 outputs the determination signal of the valid signal indicating the determination result that the ASC mode is executed to the logic circuit 65. On the other hand, even when the transition signal of the ASC_EN terminal is the valid signal instantaneously, when the number of times counted from the pulse of the transmission transition signal does not reach N times within the determination cycle, the ASC mode determination circuit 63 does not determine that the ASC mode is executed. In this case, the ASC mode determination circuit 63 outputs the determination signal of the invalid signal indicating the determination result that the normal mode is executed to the logic circuit 65. According to such a configuration, erroneous determination of the ASC mode determination circuit 63 due to noise can be prevented.

When the ASC mode determination circuit 63 determines that the ASC mode is executed, the logic circuit 65 rejects the first transmission control signal corresponding to the first control signal, and outputs the driving signal to the OUT terminal based on the second transmission control signal corresponding to the second control signal.

7

<ASC Mode During Abnormality Detection>

When the abnormality is generated in the semiconductor element or the like during the ASC mode, the valid signal is input to the ErrIN terminal of the secondary circuit 5. When the valid signal is input to the ErrIN terminal, the abnormality detection and protection operation circuit 64 detects the abnormality of the semiconductor element, and outputs the abnormality detection signal of the valid signal to the logic circuit 65.

When the ASC mode determination circuit 63 determines that the ASC mode is executed and when the abnormality detection and protection operation circuit 64 detects the abnormality of the semiconductor element, the logic circuit 65 outputs the driving signal to the OUT terminal based on the second transmission control signal corresponding to the second control signal. According to such a configuration, during the ASC mode, the operation in the ASC mode can be continued regardless of the detection result of the abnormality detection and protection operation circuit 64.

Summary of First Preferred Embodiment

According to the semiconductor element driving apparatus of the first preferred embodiment, the ASC mode determination circuit 63 of the secondary circuit 5 determines whether the normal mode or the ASC mode is executed based on the transmission transition signal corresponding to the transition signal. According to such a configuration, the secondary circuit 5 can make the operation in the ASC mode during the abnormality detection different from the operation during the normal mode during the abnormality detection based on the determination result of the ASC mode determination circuit 63.

Second Preferred Embodiment

Figure 4:
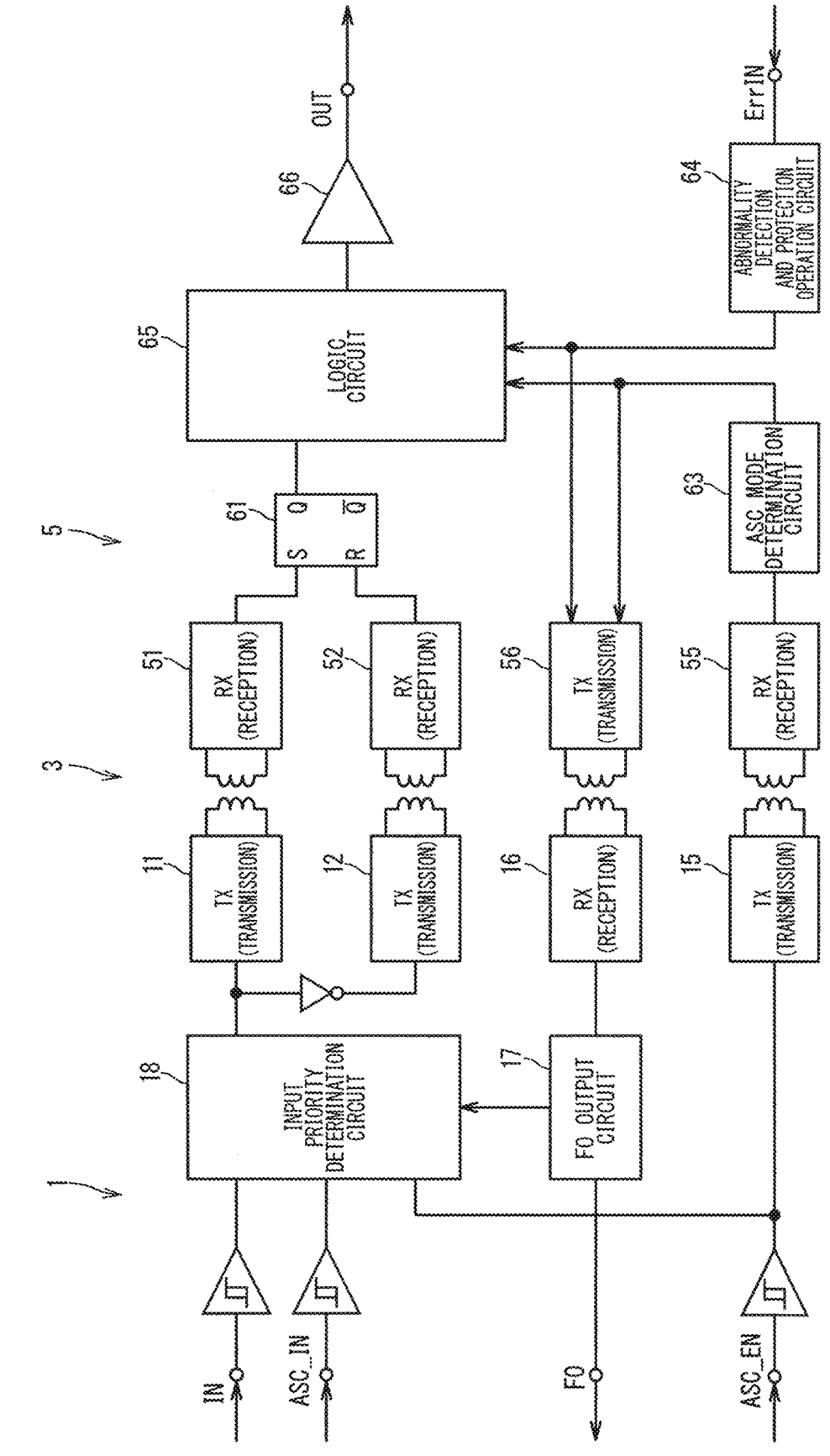
FIG. 4 is a circuit diagram illustrating a configuration of a semiconductor element driving apparatus according to a second preferred embodiment.

FIG. 4 is a circuit diagram illustrating a configuration of a semiconductor element driving apparatus according to a second preferred embodiment. The configuration of the primary circuit 1 in FIG. 4 is similar to a configuration in which a demodulation circuit 16, an FO output circuit 17 that is an output circuit, an input priority determination circuit 18, and an FO terminal that is a terminal are added to the configuration of the primary circuit 1 in FIG. 1, and the modulation circuits 13, 14 are deleted. The configuration of the secondary circuit 5 in FIG. 4 is similar to the configuration, in which the modulation circuit 56 is added to the configuration of the secondary circuit 5 in FIG. 1 and the demodulation circuits 53, 54 and the pulse restoration circuit 62 are deleted.

The modulation circuit 56 of the secondary circuit 5 generates the modulation signal including the burst pulse based on the determination signal of the ASC mode determination circuit 63 and the abnormality detection signal of the abnormality detection and protection operation circuit 64.

The demodulation circuit 16 of the primary circuit 1 generates a burst signal including the burst pulse based on the modulation signal transmitted from the secondary circuit 5 through the signal transmission circuit 3. The FO output circuit 17 smooths the burst signal generated by the demodulation circuit 16, and generates a transmission result signal corresponding to the determination signal of the ASC mode determination circuit 63 and to the abnormality detection signal of the abnormality detection and protection operation circuit 64. In the second preferred embodiment, the transmission result signal corresponds to an OR signal of the determination signal of the ASC mode determination circuit 63 and the abnormality detection signal of the abnormality detection and protection operation circuit 64, but may correspond to either the determination signal or the abnormality detection signal.

The input priority determination circuit 18 selects the first control signal of the IN terminal and the second control signal of the ASC_IN terminal based on the transmission result signal of the FO output circuit 17 and the transition signal of the ASC_EN terminal, and outputs one of the first control signal of the IN terminal and the second control signal of the ASC_IN terminal to the signal transmission circuit 3 through the modulation circuits 11, 12. The FO terminal is a terminal that outputs the transmission result signal corresponding to the determination signal of the ASC mode determination circuit 63 and to the abnormality detection signal of the abnormality detection and protection operation circuit 64 to the outside.

FIG. 5 is a timing chart illustrating the operation of the semiconductor element driving apparatus according to the second preferred embodiment. The normal mode, the normal mode during the abnormality detection, the ASC mode, and the ASC mode during the abnormality detection will be described below. In the following description of each mode, an overlapping content will be omitted as appropriate.
<Normal Mode>

The transition signal of an invalid signal is input to the ASC_EN terminal during the normal mode. When the transition signal is the invalid signal, the input priority determination circuit 18 determines that the normal mode is executed regardless of the output signal of the FO output circuit 17. In this case, the input priority determination circuit 18 rejects the second control signal of the ASC_IN terminal, and outputs the first control signal of the IN terminal to the modulation circuits 11, 12.

The modulation circuits 11, 12 generate the modulation signals by performing the edge trigger modulation on the first control signal. The modulation signals generated by the modulation circuits 11, 12 are provided to the demodulation circuits 51, 52 through the signal transmission circuit 3, respectively.

The demodulation circuits 51, 52 output edge trigger signals equivalent to the modulation signals generated by the modulation circuits 11, 12 to an S terminal and a R terminal of the pulse restoration circuit 61, respectively. The pulse restoration circuit 61 generates the first transmission control signal having substantially the same waveform as the first control signal input to the primary circuit 1 based on the edge trigger signals output from the demodulation circuits 51, 52, and outputs the first transmission control signal from a Q terminal to the logic circuit 65.

When the transition signal of the invalid signal is input to the modulation circuit 15, the modulation circuit 15 outputs the invalid signal, the invalid signal is transmitted to the demodulation circuit 55 through the signal transmission circuit 3, and the demodulation circuit 55 outputs the transmission transition signal of the invalid signal to the ASC mode determination circuit 63. The ASC mode determination circuit 63 determines that the normal mode is executed based on the transmission transition signal of the invalid signal, and outputs the determination signal of the invalid signal indicating the determination result to the logic circuit 65.

When the ASC mode determination circuit 63 determines that the normal mode is executed, the logic circuit 65 outputs the driving signal to the OUT terminal based on the first transmission control signal corresponding to the first control signal of the IN terminal.

<Normal Mode During Abnormality Detection>

When the abnormality is generated in the semiconductor element or the like during the normal mode, the valid signal is input to the ErrIN terminal of the secondary circuit 5. When the valid signal is input to the ErrIN terminal, the abnormality detection and protection operation circuit 64 detects the abnormality of the semiconductor element and outputs the abnormality detection signal of the valid signal to the logic circuit 65 and the modulation circuit 56.

When the ASC mode determination circuit 63 determines that the normal mode is executed and when the abnormality detection and protection operation circuit 64 detects the abnormality of the semiconductor element, the logic circuit 65 outputs the signal that shuts down the semiconductor element to the OUT terminal regardless of the first transmission control signal.

When the abnormality detection signal of the abnormality detection and protection operation circuit 64 is the valid signal, the modulation circuit 56 generates the modulation signal including the burst pulse by OOK. The modulation signal is transmitted to the demodulation circuit 16 through the signal transmission circuit 3, and the demodulation circuit 16 outputs the burst signal corresponding to the modulation signal to the FO output circuit 17. The burst signal has substantially the same waveform as the modulation signal of the modulation circuit 56.

The FO output circuit 17 smooths the burst signal of the demodulation circuit 16 and generates the transmission result signal corresponding to the determination signal of the ASC mode determination circuit 63 and to the abnormality detection signal of the abnormality detection and protection operation circuit 64.

The transmission result signal is output to the FO terminal, and an external apparatus on the side of the primary circuit 1 can check the abnormality of the semiconductor element from the transmission result signal of the FO terminal. In addition, the transmission of the transmission result signal can be implemented by a pair of insulating elements (in this case, a pair of transformers).

Although the transmission result signal is also output to the input priority determination circuit 18, the transition signal of the ASC_EN terminal is the invalid signal, so that the input priority determination circuit 18 determines that the normal mode is executed, and outputs the first control signal of the IN terminal to the modulation circuits 11, 12.

<Asc Mode>

During the ASC mode, the transition signal of the valid signal is input to the ASC_EN terminal. When the transition signal is the valid signal, the modulation circuit 15 generates the modulation signal including a burst pulse by OOK. The modulation signal is transmitted to the demodulation circuit 55 through the signal transmission circuit 3, and the demodulation circuit 55 outputs the transmission transition signal corresponding to the modulation signal to the ASC mode determination circuit 63. The transmission transition signal has substantially the same waveform as the modulation signal of the modulation circuit 15.

The ASC mode determination circuit 63 determines that the ASC mode is executed when the pulse of the transmission transition signal is counted N times within the determination cycle. When determining that the ASC mode is executed, the ASC mode determination circuit 63 outputs the determination signal of the valid signal indicating the determination result not only to the logic circuit 65 but also to the modulation circuit 56. On the other hand, when determining that the normal mode is executed, the ASC mode determination circuit 63 outputs the determination signal of the invalid signal indicating the determination result not only to the logic circuit 65 but also to the modulation circuit 56.

The modulation circuit 56, the signal transmission circuit 3, the demodulation circuit 16, and the FO output circuit 17 perform operations similar to the operations during the normal mode during the abnormality detection. Accordingly, the transmission result signal corresponding to the determination signal of the ASC mode determination circuit 63 and to the abnormality detection signal of the abnormality detection and protection operation circuit 64 are output to the FO terminal and the input priority determination circuit 18. The determination signal of the ASC mode determination circuit 63 is the valid signal, so that the transmission result signal also becomes the valid signal.

When the transition signal of the ASC_EN terminal is the valid signal and when the transmission result signal of the FO output circuit 17 is the valid signal, the input priority determination circuit 18 determines that the ASC mode is accepted by the secondary circuit 5. In this case, the input priority determination circuit 18 rejects the first control signal of the IN terminal and outputs the second control signal of the ASC_IN terminal to the modulation circuits 11, 12.

The modulation circuits 11, 12, the signal transmission circuit 3, the demodulation circuits 51, 52, and the pulse restoration circuit 61 perform the same operations as the operations during the normal mode on the second control signal. Accordingly, the second transmission control signal corresponding to the second control signal of the ASC_IN terminal is output to the logic circuit 65. When the ASC mode determination circuit 63 determines that the ASC mode is executed, the logic circuit 65 outputs the driving signal to the OUT terminal based on the second transmission control signal corresponding to the second control signal of the ASC_IN terminal.

<ASC Mode During Abnormality Detection>

When the abnormality is generated in the semiconductor element or the like during the ASC mode, the valid signal is input to the ErrIN terminal of the secondary circuit 5. When the valid signal is input to the ErrIN terminal, the abnormality detection and protection operation circuit 64 detects the abnormality of the semiconductor element and outputs the abnormality detection signal of the valid signal to the logic circuit 65 and the modulation circuit 56.

When the ASC mode determination circuit 63 determines that the ASC mode is executed and when the abnormality detection and protection operation circuit 64 detects the abnormality of the semiconductor element, the logic circuit 65 outputs the driving signal to the OUT terminal based on the second transmission control signal corresponding to the second control signal. According to such a configuration, during the ASC mode, the operation in the ASC mode can be continued regardless of the detection result of the abnormality detection and protection operation circuit 64.

The modulation circuit 56, the signal transmission circuit 3, the demodulation circuit 16, and the FO output circuit 17 perform operations similar to the operations during the normal mode during the abnormality detection. Accordingly, the transmission result signal corresponding to the determination signal of the ASC mode determination circuit 63 and to the abnormality detection signal of the abnormality detection and protection operation circuit 64 are output to the FO terminal and the input priority determination circuit 18. Both the determination signal of the ASC mode determination circuit 63 and the abnormality detection signal of the abnormality detection and protection operation circuit 64 are the valid signals, so that the transmission result signal also becomes the valid signal.

Summary of Second Preferred Embodiment

According to the second preferred embodiment, the input priority determination circuit 18 of the primary circuit 1 selectively outputs the first control signal of the IN terminal and the second control signal of the ASC_IN terminal to the signal transmission circuit 3 based on the transition signal of the ASC_EN terminal. According to such a configuration, the numbers of modulation circuits and demodulation circuits can be reduced as compared with the configuration of the first preferred embodiment, so that the area and the number of components of the semiconductor element driving apparatus can be reduced.

In addition, the input priority determination circuit 18 of the primary circuit 1 selectively outputs the first control signal of the IN terminal and the second control signal of the ASC_IN terminal to the signal transmission circuit 3 based on the transmission result signal of the FO output circuit 17 and the transition signal of the ASC_EN terminal. According to such a configuration, the input priority determination circuit 18 can perform control to switch the first control signal and the second control signal in consideration of the transmission result signal reflecting the determination result of the ASC mode determination circuit 63.

Third Preferred Embodiment

Figure 6:
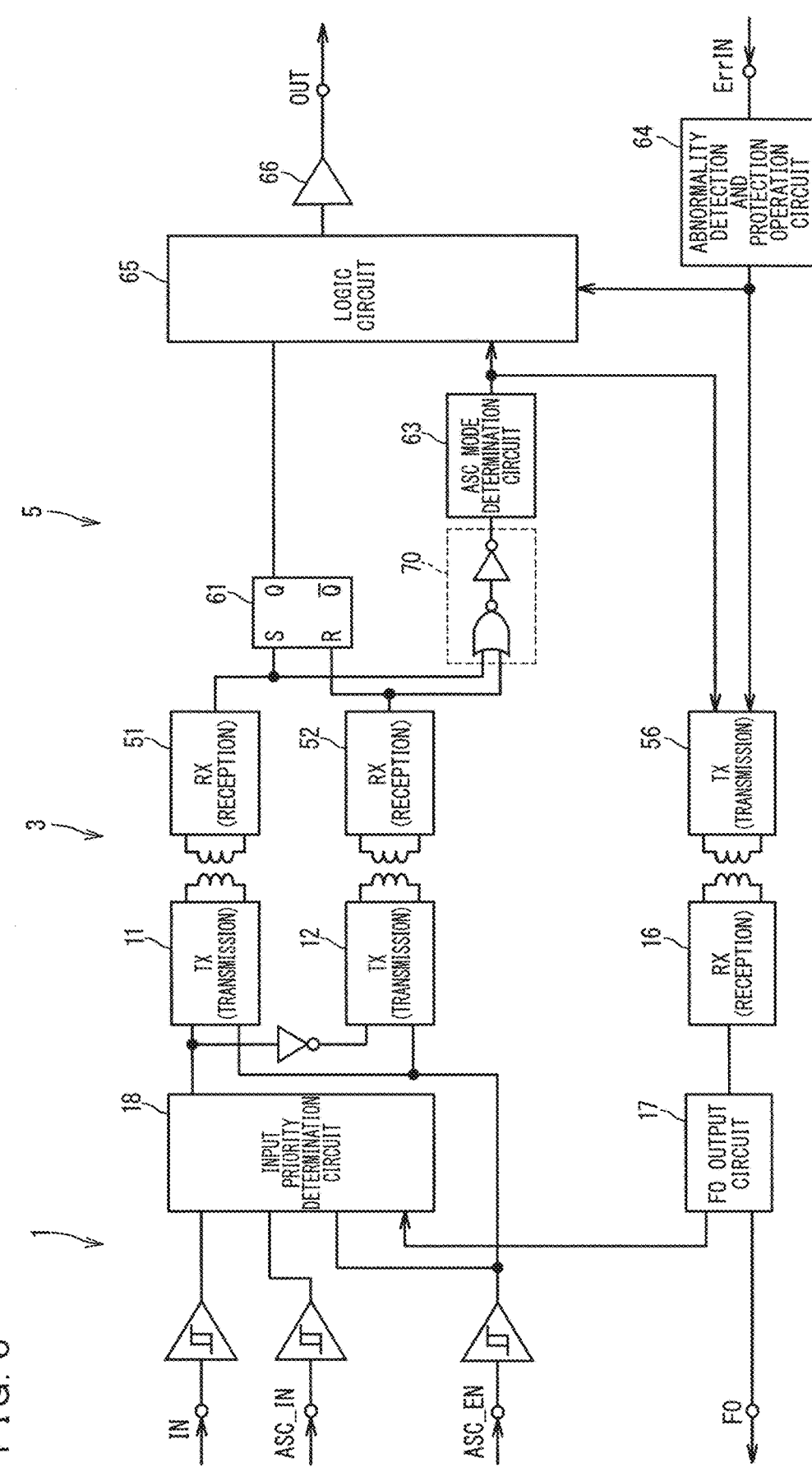
FIG. 6 is a circuit diagram illustrating a configuration of a semiconductor element driving apparatus according to a third preferred embodiment.

FIG. 6 is a circuit diagram illustrating a configuration of a semiconductor element driving apparatus according to a third preferred embodiment. The configuration of the primary circuit 1 in FIG. 6 is similar to the configuration of the primary circuit 1 in FIG. 4, in which the transition signal of the ASC_EN terminal is input to the modulation circuits 11, 12 and the modulation circuit 15 is deleted. The configuration of the secondary circuit in FIG. 6 is similar to the configuration, in which the OR circuit 70 is added to the configuration of the secondary circuit 5 in FIG. 4 and the demodulation circuit 55 is removed.

When the transition signal of the ASC_EN terminal is the invalid signal, the modulation circuits 11, 12 of the primary circuit 1 perform the edge trigger modulation on the output signal of the input priority determination circuit 18 in the same operation as the modulation circuits 11, 12 of the second preferred embodiment. On the other hand, when the transition signal of the ASC_EN terminal is the valid signal, the modulation circuits 11, 12 generate the modulation signal including the burst pulse by performing OOK on the output signal of the input priority determination circuit 18.

The OR circuit 70 of the secondary circuit 5 outputs the OR signal of the output signals of the demodulation circuits 51, 52 to the ASC mode determination circuit 63.

Figure 7:
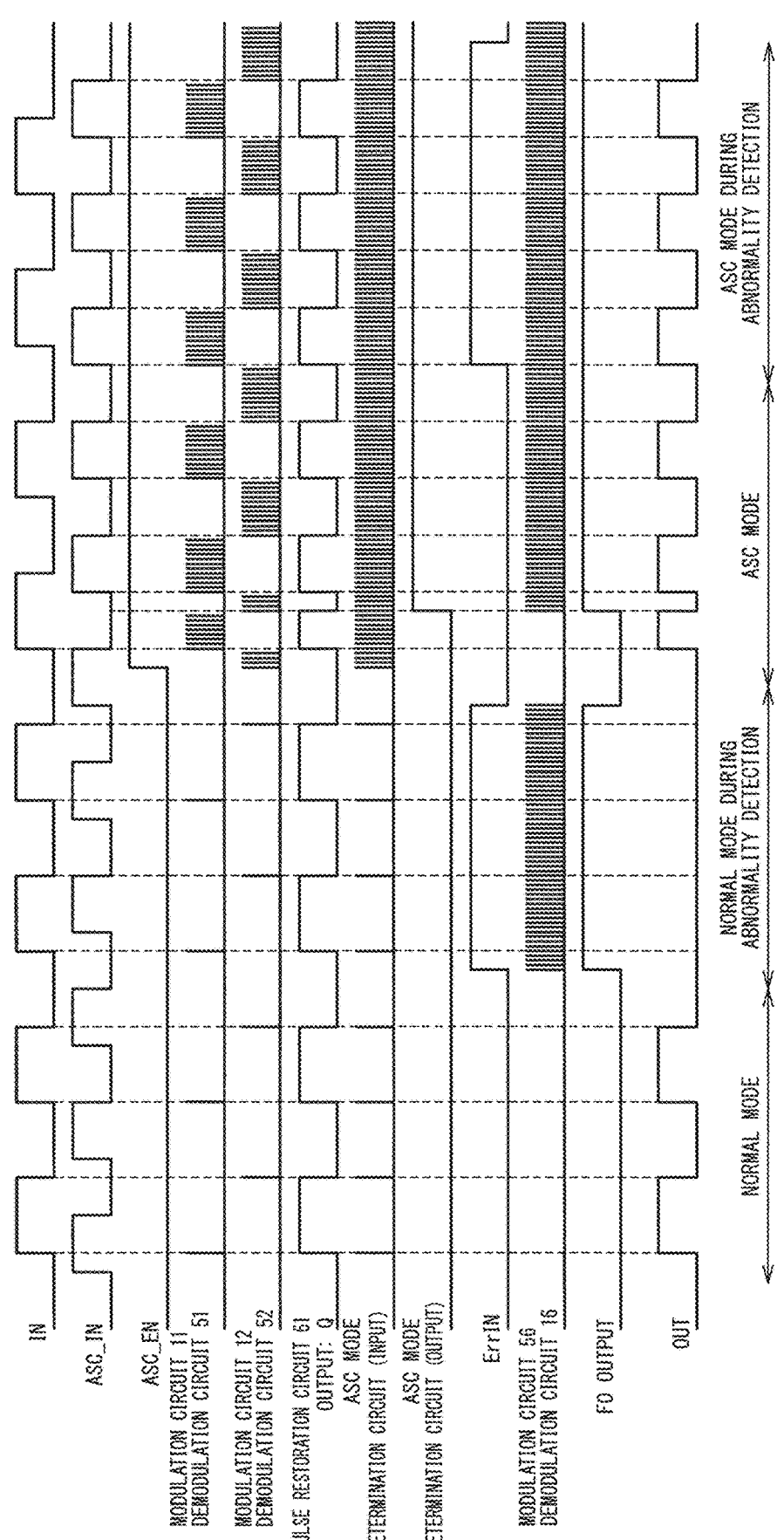
FIG. 7 is a timing chart illustrating operation of the semiconductor element driving apparatus according to the third preferred embodiment.

FIG. 7 is a timing chart illustrating the operation of the semiconductor element driving apparatus according to the third preferred embodiment. The normal mode, the normal mode during the abnormality detection, the ASC mode, and the ASC mode during the abnormality detection will be described below. In the following description of each mode, an overlapping content will be omitted as appropriate.
<Normal Mode>

In the third preferred embodiment, the OR signal from the OR circuit 70 is input to the ASC mode determination circuit

63. However, the interval of the pulses of the OR signal during the normal mode is relatively long, so that the ASC mode determination circuit 63 determines that the normal mode is executed without counting the pulses of the transmission transition signal N times within the determination cycle.

The subsequent normal mode according to the third preferred embodiment is similar to the normal mode according to the second preferred embodiment. That is, the input priority determination circuit 18 outputs the first control signal of the IN terminal, and the logic circuit 65 outputs the driving signal to the OUT terminal based on the first transmission control signal corresponding to the first control signal.
<Normal Mode During Abnormality Detection>

The normal mode during the abnormality detection according to the third preferred embodiment is similar to the normal mode during the abnormality detection according to the second preferred embodiment. That is, the abnormality detection and protection operation circuit 64 outputs the abnormality detection signal of the valid signal to the logic circuit 65, and the logic circuit 65 outputs the signal that shuts down the semiconductor element to the OUT terminal regardless of the first transmission control signal. In addition, the transmission result signal of the valid signal corresponding to the determination signal of the ASC mode determination circuit 63 and to the abnormality detection signal of the abnormality detection and protection operation circuit 64 is output to the FO terminal of the primary circuit 1.
<Asc Mode>

During the ASC mode, the transition signal of the valid signal is input to the ASC_EN terminal. In this case, the modulation circuits 11, 12 generate the modulation signal including the burst pulse according to the period of the output signal of the input priority determination circuit 18 by performing OOK on the output signal without performing the edge trigger modulation.

The modulation signal is transmitted to the demodulation circuits 51, 52 through the signal transmission circuit 3, and the demodulation circuits 51, 52 output the signals corresponding to the modulation signal to the S terminal and the R terminal of the pulse restoration circuit 61, respectively. Furthermore, the demodulation circuits 51, 52 output the signal corresponding to the modulation signal to the OR circuit 70.

The OR circuit 70 outputs the OR signal of the output signals of the demodulation circuits 51, 52 to the ASC mode determination circuit 63 as the transmission transition signal. Similarly to the transmission transition signal of the second preferred embodiment, the ASC mode determination circuit 63 counts the pulses of the transmission transition signal including the burst pulses predetermined N times within the determination cycle, and thus determines that the ASC mode is executed.

The subsequent ASC mode according to the third preferred embodiment is similar to the ASC mode according to the second preferred embodiment. That is, the input priority determination circuit 18 outputs the second control signal of the ASC_IN terminal, and the logic circuit 65 outputs the driving signal to the OUT terminal based on the second transmission control signal corresponding to the second control signal. In addition, the transmission result signal of the valid signal corresponding to the determination signal of the ASC mode determination circuit 63 and to the abnormality detection signal of the abnormality detection and protection operation circuit 64 is output to the FO terminal of the primary circuit 1.

<ASC Mode During Abnormality Detection>

As described in the ASC mode, the ASC mode during the abnormality detection according to the third preferred embodiment is similar to the ASC mode during the abnormality detection according to the second preferred embodiment except that a process of generating the transmission transition signal is different from that in the second preferred embodiment. That is, the abnormality detection and protection operation circuit 64 outputs the abnormality detection signal of the valid signal to the logic circuit 65, and the logic circuit 65 outputs the driving signal to the OUT terminal based on the second transmission control signal corresponding to the second control signal. In addition, the transmission result signal of the valid signal corresponding to the determination signal of the ASC mode determination circuit 63 and to the abnormality detection signal of the abnormality detection and protection operation circuit 64 is output to the FO terminal of the primary circuit 1.

Summary of Third Preferred Embodiment

According to the third preferred embodiment, the numbers of modulation circuits and demodulation circuits can be reduced as compared with the configuration of the second preferred embodiment, so that the area and the number of components of the semiconductor element driving apparatus can be reduced. The modulation circuits 11, 12 may generate and output the modulation signals by OOK also during the normal mode as long as the modulation signals do not affect the determination of the ASC mode determination circuit 63. According to such a configuration, the secondary circuit 5 can check a start of the primary power supply of the primary circuit 1.

Fourth Preferred Embodiment

FIG. 8 is a circuit diagram illustrating a configuration of a semiconductor element driving apparatus according to a fourth preferred embodiment. The configuration of the primary circuit 1 in FIG. 8 is similar to the configuration of the primary circuit 1 in FIG. 6 in which the ASC_IN terminal, the ASC_EN terminal, and the input priority determination circuit 18 are deleted. The configuration of the secondary circuit 5 in FIG. 8 is similar to the configuration of the secondary circuit 5 in FIG. 6 in which a waveform shaping circuit 72 is added.

In the fourth preferred embodiment, a plurality of signals are selectively input to the IN terminal of the primary circuit 1. The plurality of signals include the first control signal and the control transition signal. The control transition signal corresponds to the second control signal and to the transition signal described above, and includes the burst pulse having a pulse width shorter than that of the first control signal.

The ASC mode determination circuit 63 determines whether the normal mode or the ASC mode is executed based on the transmission transition signal corresponding to the control transition signal.

The modulation circuits 11, 12, the demodulation circuits 51, 52, and the pulse restoration circuit 61 generate the signal including the burst pulse corresponding to the control transition signal. In the fourth preferred embodiment, the signal output from the pulse restoration circuit 61 has substantially the same waveform as the control transition signal. The waveform shaping circuit 72 generates the second transmission control signal that is a square wave signal based on the signal output from the pulse restoration circuit 61. When the ASC mode determination circuit 63 determines that the ASC mode is executed, the logic circuit 65 drives the semiconductor element based on the second transmission control signal that is the square wave signal generated by the waveform shaping circuit 72.

Figure 9:
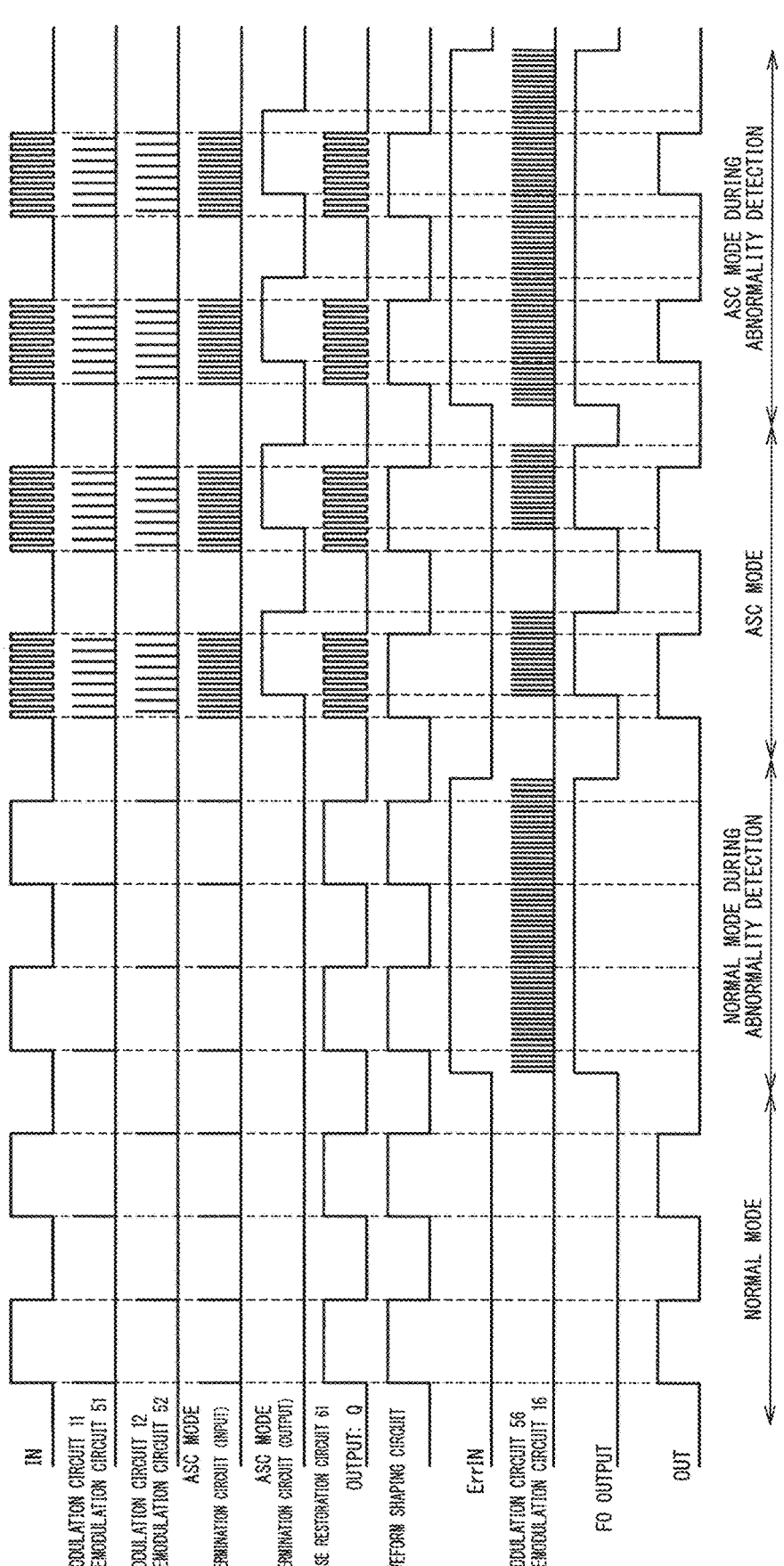
FIG. 9 is a timing chart illustrating operation of the semiconductor element driving apparatus according to the fourth preferred embodiment.

FIG. 9 is a timing chart illustrating the operation of the semiconductor element driving apparatus according to the fourth preferred embodiment. The normal mode, the normal mode during the abnormality detection, the ASC mode, and the ASC mode during the abnormality detection will be described below. In the following description of each mode, an overlapping content will be omitted as appropriate.

<Normal Mode>

The first control signal is input to the IN terminal during the normal mode. The modulation circuits 11, 12 generate the modulation signals by performing the edge trigger modulation on the first control signal. The modulation signals generated by the modulation circuits 11, 12 are provided to the demodulation circuits 51, 52 through the signal transmission circuit 3, respectively.

The demodulation circuits 51, 52 output edge trigger signals equivalent to the modulation signals generated by the modulation circuits 11, 12 to an S terminal and a R terminal of the pulse restoration circuit 61, respectively. The pulse restoration circuit 61 generates the first transmission control signal having substantially the same waveform as the first control signal input to the primary circuit 1 based on the edge trigger signals output from the demodulation circuits 51, 52, and outputs the first transmission control signal from the Q terminal to the waveform shaping circuit 72. The first transmission control signal has a frequency less than the threshold, so that the waveform shaping circuit 72 outputs the first transmission control signal to the logic circuit 65.

The ASC mode determination circuit 63 does not count the pulses of the transmission transition signal N times within the determination cycle, and thus determines that the normal mode is executed. Unlike the ASC mode determination circuit 63 according to the first to third preferred embodiments, the ASC mode determination circuit 63 according to the fourth preferred embodiment sequentially determines, for each signal provided to the IN terminal, whether the signal is the first control signal during the normal mode or the control transition signal during the ASC mode.

As a result of the above operation, the logic circuit 65 outputs the driving signal to the OUT terminal based on the first transmission control signal corresponding to the first control signal.

<Normal Mode During Abnormality Detection>

The normal mode during the abnormality detection according to the fourth preferred embodiment is similar to the normal mode during the abnormality detection according to the third preferred embodiment. That is, the abnormality detection and protection operation circuit 64 outputs the abnormality detection signal of the valid signal to the logic circuit 65, and the logic circuit 65 outputs the signal that shuts down the semiconductor element to the OUT terminal regardless of the first transmission control signal. In addition, the transmission result signal of the valid signal corresponding to the determination signal of the ASC mode determination circuit 63 and to the abnormality detection signal of the abnormality detection and protection operation circuit 64 is output to the FO terminal of the primary circuit 1.

<Asc Mode>

The control transition signal is input to the IN terminal during the ASC mode. The modulation circuits 11, 12 generate the modulation signal including the burst pulse by performing the edge trigger modulation on the control transition signal. The modulation signals generated by the modulation circuits 11, 12 are provided to the demodulation circuits 51, 52 through the signal transmission circuit 3, respectively.

The demodulation circuits 51, 52 output edge trigger signals equivalent to the modulation signals generated by the modulation circuits 11, 12 to an S terminal and a R terminal of the pulse restoration circuit 61, respectively. In addition, the demodulation circuits 51, 52 output the edge trigger signals equivalent to the modulation signals generated by the modulation circuits 11, 12 to the OR circuit 70.

The pulse restoration circuit 62 generates the signal having substantially the same waveform as the control transition signal input to the primary circuit 1 based on the edge trigger signal output from the demodulation circuits 51, 52, and outputs the signal from the Q terminal to the waveform shaping circuit 72. The signal output from the pulse restoration circuit 62 has the frequency equal to or higher than the threshold, so that the waveform shaping circuit 72 generates the second transmission control signal that is the square wave signal based on the signal, and outputs the second transmission control signal to the logic circuit 65.

The OR circuit 70 outputs the OR signal of the edge trigger signals output from the demodulation circuits 51, 52 to the ASC mode determination circuit 63. Similarly to the transmission transition signal of the third preferred embodiment, the ASC mode determination circuit 63 counts the pulses of the OR signal including the burst pulse predetermined N times within the determination cycle, and thus determines that the ASC mode is executed.

The subsequent ASC mode according to the third preferred embodiment is similar to the ASC mode according to the third preferred embodiment. That is, the logic circuit 65 outputs the driving signal to the OUT terminal based on the second transmission control signal corresponding to the second control signal. In addition, the transmission result signal of the valid signal corresponding to the determination signal of the ASC mode determination circuit 63 and to the abnormality detection signal of the abnormality detection and protection operation circuit 64 is output to the FO terminal of the primary circuit 1.

<ASC Mode During Abnormality Detection>

When the ASC mode determination circuit 63 determines that the ASC mode is executed and when the abnormality detection and protection operation circuit 64 detects the abnormality of the semiconductor element, the logic circuit 65 outputs the driving signal to the OUT terminal based on the second transmission control signal corresponding to the second control signal. In addition, the transmission result signal of the valid signal corresponding to the determination signal of the ASC mode determination circuit 63 and to the abnormality detection signal of the abnormality detection and protection operation circuit 64 is output to the FO terminal of the primary circuit 1.

Summary of Fourth Preferred Embodiment

According to the semiconductor element driving apparatus of the fourth preferred embodiment, similarly to the first to third preferred embodiment, the ASC mode determination circuit 63 of the secondary circuit 5 determines whether the normal mode or the ASC mode is executed based on the transmission transition signal corresponding to the transition signal. According to such a configuration, the secondary circuit 5 can make the operation in the ASC mode during the abnormality detection different from the operation during the normal mode during the abnormality detection based on the determination result of the ASC mode determination circuit 63.

Furthermore, according to the fourth preferred embodiment, the ASC_IN terminal, the ASC_EN terminal, and the input priority determination circuit 18 can be reduced from the configuration of the third preferred embodiment, the reduction in the area and the number of components of the semiconductor element driving apparatus can be expected.

The preferred embodiments can be freely combined, and the preferred embodiments can be appropriately modified or omitted.

Hereinafter, various aspects of the present disclosure will be collectively described as appendixes.

(Appendix 1)

A semiconductor element driving apparatus comprising:
a primary circuit to which a plurality of signals including a first control signal controlling driving of a semiconductor element during a normal mode, a second control signal controlling driving of the semiconductor element during an ASC mode, and a transition signal transitioning from the normal mode to the ASC mode, or including the first control signal and a control transition signal corresponding to the second control signal and to the transition signal are input;
a signal transmission circuit including an insulating element capable of transmitting a signal; and
a secondary circuit that drives the semiconductor element based on a plurality of transmission signals corresponding to the plurality of signals transmitted from the primary circuit through the signal transmission circuit,
wherein the secondary circuit includes:
an ASC mode determination circuit that determines whether the normal mode or the ASC mode is executed based on a transmission transition signal corresponding to the transition signal or to the control transition signal among the plurality of transmission signals; and
a logic circuit that drives the semiconductor element based on a first transmission control signal corresponding to the first control signal among the plurality of transmission signals when the ASC mode determination circuit determines that the normal mode is executed, and drives the semiconductor element based on a second transmission control signal corresponding to the second control signal or to the control transition signal among the plurality of transmission signals when the ASC mode determination circuit determines that the ASC mode is executed.

(Appendix 2)

The semiconductor element driving apparatus according to appendix 1, wherein
the transmission transition signal includes a burst pulse, and
the ASC mode determination circuit determines that the ASC mode is executed when the pulse of the transmission transition signal is counted a predetermined number of times within a predetermined period.

(Appendix 3)

The semiconductor element driving apparatus according to appendix 1 or 2, wherein the secondary circuit further includes an abnormality detection circuit that detects an abnormality of the semiconductor element, and the logic circuit performs operation of protecting the semiconductor element regardless of the first transmission control signal when the ASC mode determination circuit determines that the normal mode is executed and when the abnormality detection circuit detects the abnormality of the semiconductor element, and drives the semiconductor element based on the second transmission control signal when the ASC mode determination circuit determines that the ASC mode is executed and when the abnormality detection circuit detects the abnormality of the semiconductor element.

(Appendix 4)

The semiconductor element driving apparatus according to any one of appendixes 1 to 3, wherein the primary circuit includes a modulation circuit that generates a modulation signal based on rising and falling edges of the first control signal, and the secondary circuit includes a demodulation circuit that generates an edge trigger signal used to generate the first transmission control signal based on the modulation signal transmitted from the primary circuit through the signal transmission circuit.

(Appendix 5)

The semiconductor element driving apparatus according to appendix 4, wherein the secondary circuit further includes a pulse restoration circuit that generates the first transmission control signal based on the edge trigger signal.

(Appendix 6)

The semiconductor element driving apparatus according to appendix 1 or 2, wherein the secondary circuit further includes an abnormality detection circuit that outputs an abnormality detection signal indicating a detection result of an abnormality of the semiconductor element, and the primary circuit includes a terminal that outputs a transmission result signal corresponding to the abnormality detection signal transmitted from the secondary circuit through the signal transmission circuit to an outside.

(Appendix 7)

The semiconductor element driving apparatus according to appendix 1 or 2, wherein the secondary circuit includes:

an abnormality detection circuit that outputs an abnormality detection signal indicating a detection result of an abnormality of the semiconductor element; and a modulation circuit that generates a modulation signal including a burst pulse based on the abnormality detection signal, and the primary circuit includes:

a demodulation circuit that generates a burst signal including a burst pulse based on the modulation signal transmitted from the secondary circuit through the signal transmission circuit; and an output circuit that smooths the burst signal and generates a transmission result signal corresponding to the abnormality detection signal.

(Appendix 8)

The semiconductor element driving apparatus according to any one of appendixes 1 to 7, wherein the plurality of signals includes the first control signal, the second control signal, and the transition signal, and the primary circuit includes an input priority determination circuit that selectively outputs the first control signal and the second control signal to the signal transmission circuit based on the transition signal.

(Appendix 9)

The semiconductor element driving apparatus according to appendix 8, wherein the secondary circuit further includes the abnormality detection circuit that detects the abnormality of the semiconductor element, and the input priority determination circuit selectively outputs the first control signal and the second control signal to the signal transmission circuit based on the transmission result signal corresponding to a determination result of the ASC mode determination circuit and to a detection result of the abnormality detection circuit, which are transmitted from the secondary circuit through the signal transmission circuit, and the transition signal.

(Appendix 10)

The semiconductor element driving apparatus according to any one of appendixes 1 to 7, wherein the plurality of signals includes the first control signal and the control transition signal, and the secondary circuit includes a waveform shaping circuit that generates the second transmission control signal that is a square wave signal based on a signal including a burst pulse corresponding to the control transition signal transmitted from the primary circuit through the signal transmission circuit.

(Appendix 11)

The semiconductor element driving apparatus according to any one of appendixes 1 to 10, wherein the insulating element includes a transformer magnetically coupled to each other.

(Appendix 12)

The semiconductor element driving apparatus according to any one of appendixes 1 to 10, wherein the insulating element includes a capacitor capacitively coupled to each other.

(Appendix 13)

The semiconductor element driving apparatus according to any one of appendixes 1 to 10, wherein the insulating element includes a photocoupler optically coupled to each other.

While the disclosure has been shown and described in detail, the foregoing description is in all aspects illustrative and not restrictive. It is therefore understood that numerous modifications and variations can be devised.

What is claimed is:

1. A semiconductor element driving apparatus comprising:

a primary circuit to which a plurality of signals including a first control signal controlling driving of a semiconductor element during a normal mode, a second control signal controlling driving of the semiconductor element during an ASC mode, and a transition signal transitioning from the normal mode to the ASC mode, or including the first control signal and a control transition signal corresponding to the second control signal and to the transition signal are input;

a signal transmission circuit including an insulating element capable of transmitting a signal; and a secondary circuit that drives the semiconductor element based on a plurality of transmission signals corresponding to the plurality of signals transmitted from the primary circuit through the signal transmission circuit, wherein the secondary circuit includes:

an ASC mode determination circuit that determines whether the normal mode or the ASC mode is executed based on a transmission transition signal corresponding to the transition signal or to the control transition signal among the plurality of transmission signals; and a logic circuit that drives the semiconductor element based on a first transmission control signal corresponding to the first control signal among the plurality of transmission signals when the ASC mode determination circuit determines that the normal mode is executed, and drives the semiconductor element based on a second transmission control signal corresponding to the second control signal or to the control transition signal among the plurality of transmission signals when the ASC mode determination circuit determines that the ASC mode is executed.

2. The semiconductor element driving apparatus according to claim 1, wherein the transmission transition signal includes a burst pulse, and the ASC mode determination circuit determines that the ASC mode is executed when the pulse of the transmission transition signal is counted a predetermined number of times within a predetermined period.

3. The semiconductor element driving apparatus according to claim 1, wherein the secondary circuit further includes an abnormality detection circuit that detects an abnormality of the semiconductor element, and the logic circuit performs operation of protecting the semiconductor element regardless of the first transmission control signal when the ASC mode determination circuit determines that the normal mode is executed and when the abnormality detection circuit detects the abnormality of the semiconductor element, and drives the semiconductor element based on the second transmission control signal when the ASC mode determination circuit determines that the ASC mode is executed and when the abnormality detection circuit detects the abnormality of the semiconductor element.

4. The semiconductor element driving apparatus according to claim 1, wherein the primary circuit includes a modulation circuit that generates a modulation signal based on rising and falling edges of the first control signal, and the secondary circuit includes a demodulation circuit that generates an edge trigger signal used to generate the first transmission control signal based on the modulation signal transmitted from the primary circuit through the signal transmission circuit.

5. The semiconductor element driving apparatus according to claim 4, wherein the secondary circuit further includes a pulse restoration circuit that generates the first transmission control signal based on the edge trigger signal.

6. The semiconductor element driving apparatus according to claim 1, wherein the secondary circuit further includes an abnormality detection circuit that outputs an abnormality detection signal indicating a detection result of an abnormality of the semiconductor element, and the primary circuit includes a terminal that outputs a transmission result signal corresponding to the abnormality detection signal transmitted from the secondary circuit through the signal transmission circuit to an outside.

7. The semiconductor element driving apparatus according to claim 1, wherein the secondary circuit includes:

an abnormality detection circuit that outputs an abnormality detection signal indicating a detection result of an abnormality of the semiconductor element; and a modulation circuit that generates a modulation signal including a burst pulse based on the abnormality detection signal, and the primary circuit includes:

a demodulation circuit that generates a burst signal including a burst pulse based on the modulation signal transmitted from the secondary circuit through the signal transmission circuit; and an output circuit that smooths the burst signal and generates a transmission result signal corresponding to the abnormality detection signal.

8. The semiconductor element driving apparatus according to claim 1, wherein the plurality of signals includes the first control signal, the second control signal, and the transition signal, and the primary circuit includes an input priority determination circuit that selectively outputs the first control signal and the second control signal to the signal transmission circuit based on the transition signal.

9. The semiconductor element driving apparatus according to claim 8, wherein the secondary circuit further includes the abnormality detection circuit that detects the abnormality of the semiconductor element, and the input priority determination circuit selectively outputs the first control signal and the second control signal to the signal transmission circuit based on the transmission result signal corresponding to a determination result of the ASC mode determination circuit and to a detection result of the abnormality detection circuit, which are transmitted from the secondary circuit through the signal transmission circuit, and the transition signal.

10. The semiconductor element driving apparatus according to claim 1, wherein the plurality of signals includes the first control signal and the control transition signal, and the secondary circuit includes a waveform shaping circuit that generates the second transmission control signal that is a square wave signal based on a signal including a burst pulse corresponding to the control transition signal transmitted from the primary circuit through the signal transmission circuit.

11. The semiconductor element driving apparatus according to claim 1, wherein the insulating element includes a transformer magnetically coupled to each other.

12. The semiconductor element driving apparatus according to claim 1, wherein the insulating element includes a capacitor capacitively coupled to each other.

13. The semiconductor element driving apparatus according to claim 1, wherein the insulating element includes a photocoupler optically coupled to each other.

* * * * *